United States Patent
Nayak

(10) Patent No.: US 11,337,338 B2
(45) Date of Patent: May 17, 2022

(54) CONDUCTIVE THERMAL MANAGEMENT ARCHITECTURE EMPLOYING A STIFFENER OF A PRINTED WIRING BOARD ASSEMBLY

(71) Applicant: Hamilton Sundstrand Corporation, Charlotte, NC (US)

(72) Inventor: Hebri Vijayendra Nayak, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 38 days.

(21) Appl. No.: 16/821,507

(22) Filed: Mar. 17, 2020

(65) Prior Publication Data

US 2021/0298197 A1     Sep. 23, 2021

(51) Int. Cl.
*H05K 5/00* (2006.01)
*H05K 7/20* (2006.01)
*H05K 7/14* (2006.01)

(52) U.S. Cl.
CPC ......... *H05K 7/2039* (2013.01); *H05K 5/0021* (2013.01); *H05K 7/1404* (2013.01); *H05K 7/1427* (2013.01)

(58) Field of Classification Search
USPC ........ 361/759, 801, 802, 803, 807, 809, 810
See application file for complete search history.

(56) References Cited

U.S. PATENT DOCUMENTS

| | | | |
|---|---|---|---|
| 5,053,920 A * | 10/1991 | Staffiere | H01L 25/0655 361/694 |
| 5,414,592 A * | 5/1995 | Stout | H05K 7/1404 165/80.3 |
| 5,870,284 A | 2/1999 | Stewart et al. | |
| 6,285,553 B1 | 9/2001 | Suyama et al. | |
| 6,680,853 B1 * | 1/2004 | Dobbs | H05K 3/301 361/717 |
| 7,196,907 B2 * | 3/2007 | Zheng | H01R 13/2435 361/760 |
| 7,644,867 B2 * | 1/2010 | Lin | G06K 19/077 235/486 |
| 8,526,184 B2 * | 9/2013 | Sullivan | H05K 7/20545 361/704 |
| 9,832,860 B2 * | 11/2017 | Starkston | H01L 23/16 |
| 2003/0223197 A1 * | 12/2003 | Hulan | H05K 7/1404 361/719 |
| 2006/0044760 A1 * | 3/2006 | Pal | H05K 7/1461 361/700 |
| 2006/0171129 A1 | 8/2006 | Berto et al. | |
| 2014/0002989 A1 * | 1/2014 | Ahuja | G06F 1/20 361/679.54 |
| 2014/0048950 A1 | 2/2014 | Lin et al. | |
| 2015/0366105 A1 | 12/2015 | Dunwoody et al. | |
| 2019/0283869 A1 | 9/2019 | Broberg et al. | |

FOREIGN PATENT DOCUMENTS

CN     109600973 A     4/2019

OTHER PUBLICATIONS

Extended European Search Report for EP Application No. 21161070.4 dated Jul. 30, 2021, pp. 1-8.

* cited by examiner

*Primary Examiner* — Hung S. Bui
(74) *Attorney, Agent, or Firm* — Cantor Colburn LLP

(57) ABSTRACT

An electronic assembly includes a printed wiring board (PWB), and a stiffener secured to the PWB. The stiffener includes one or more tray sections. One or more electronic modules is secured respectively to the one or more tray sections of the stiffener.

18 Claims, 6 Drawing Sheets

CONDUCTIVE THERMAL MANAGEMENT ARCHITECTURE EMPLOYING A STIFFENER OF A PRINTED WIRING BOARD ASSEMBLY

BACKGROUND

Exemplary embodiments pertain to the art of thermal management of electronic modules and, in particular, to a conductive thermal management architecture employing a stiffener of a printed wiring board (PWB) assembly.

In a broad range of applications, printed wiring boards (PWBs) are used to support and interconnect electronic components. Individual electronic components as well as electronic modules, which include electronic components packaged together, as electronic modules. A stiffener is a frame that is used to provide mechanical support to a PWB. Generally, a stiffener should provide the necessary structural support without adding too much weight.

BRIEF DESCRIPTION

In one embodiment, an electronic assembly includes a printed wiring board (PWB), and a stiffener secured to the PWB. The stiffener includes one or more tray sections. One or more electronic modules is secured respectively to the one or more tray sections of the stiffener.

Additionally or alternatively, in this or other embodiments wedge locks secure the stiffener based on compressive force.

Additionally or alternatively, in this or other embodiments a first wedge lock mounting rail supports a first set of the wedge locks, and a second wedge lock mounting rail supports a second set of the wedge locks.

Additionally or alternatively, in this or other embodiments a first edge of the stiffener forms the first wedge lock mounting rail, and a second edge of the stiffener forms the second wedge lock mounting rail.

Additionally or alternatively, in this or other embodiments a material of the stiffener is aluminum alloy.

Additionally or alternatively, in this or other embodiments screws affix the one or more electronic modules respectively to the one or more tray sections of the stiffener.

Additionally or alternatively, in this or other embodiments screws affix the stiffener to the PWB.

Additionally or alternatively, in this or other embodiments an adhesive film adheres the stiffener to the PWB.

Additionally or alternatively, in this or other embodiments gaps are on two sides of each of the one or more tray sections of the stiffener.

Additionally or alternatively, in this or other embodiments one or more thermal pads are disposed between each of the one or more electronic modules and respective ones of the one or more tray sections of the stiffener.

In another embodiment a method of assembling an electronic assembly includes fabricating a stiffener with one or more tray sections, and securing the stiffener to a printed wiring board (PWB). One or more electronic modules is respectively secured to the one or more tray sections of the stiffener.

Additionally or alternatively, in this or other embodiments wedge locks are arranged to secure the stiffener based on compressive force.

Additionally or alternatively, in this or other embodiments a first wedge lock mounting rail supports a first set of the wedge locks, and a second wedge lock mounting rail supports a second set of the wedge locks.

Additionally or alternatively, in this or other embodiments the first wedge lock mounting rail is formed from a first edge of the stiffener, and the second wedge lock mounting rail is formed from a second edge of the stiffener.

Additionally or alternatively, in this or other embodiments the stiffener is fabricated from aluminum alloy.

Additionally or alternatively, in this or other embodiments the one or more electronic modules is respectively affixed to the one or more tray sections of the stiffener using screws.

Additionally or alternatively, in this or other embodiments the stiffener is affixed to the PWB using screws.

Additionally or alternatively, in this or other embodiments the stiffener is adhered to the PWB using an adhesive film.

Additionally or alternatively, in this or other embodiments gaps are formed on two sides of each of the one or more tray sections of the stiffener.

Additionally or alternatively, in this or other embodiments one or more thermal pads are disposed between each of the one or more electronic modules and respective ones of the one or more tray sections of the stiffener.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

As previously noted, PWBs support and interconnect electronic components individually or packaged together in an electronic module. Generally, some electronic components (e.g., resistors, capacitors) may dissipate less heat than others (e.g., diodes, magnetics) and may dissipate much less heat than electronic modules (e.g., direct current (DC)-DC converters, transistors, metal oxide field effect transistors (MOSFETs), silicon carbide MOSFETs (SiCFETs)) that house many components. Embodiments detailed herein relate to a conductive thermal management architecture employing a stiffener of a PWB. The exemplary electronic modules that are discussed for explanatory purposes are DC-DC converters. However, conductive heat transfer facilitated by the architecture detailed herein is equally applicable to other electronic modules and individual electronic components. Exemplary applications of these embodiments include deep space, underwater-based, and ground-based applications. The heat dissipation requirement, rather than the specific application, drives the use of the PWB assembly according to one or more embodiments.

Figure 1:
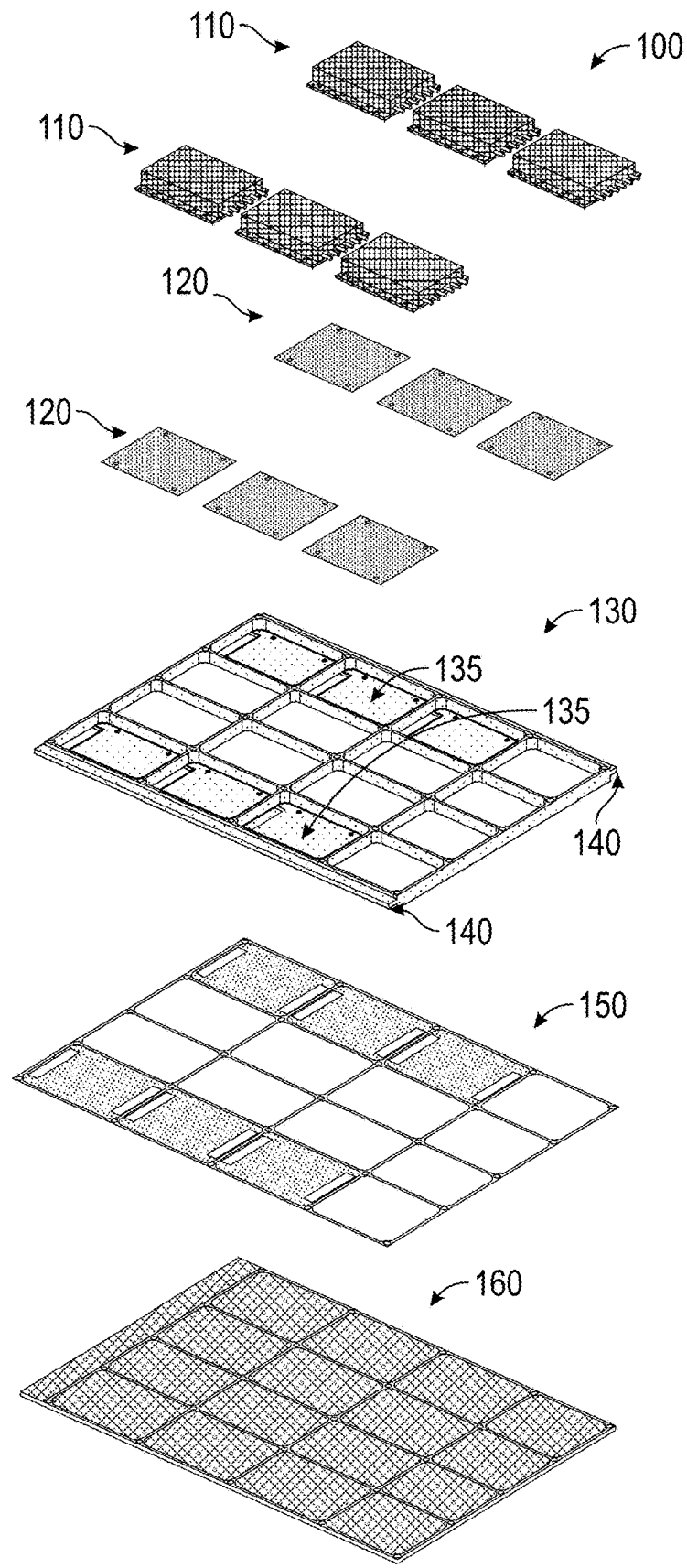
FIG. 1 is an exploded view of a printed wiring board (PWB) assembly according to one or more embodiments.
Figure 6A:
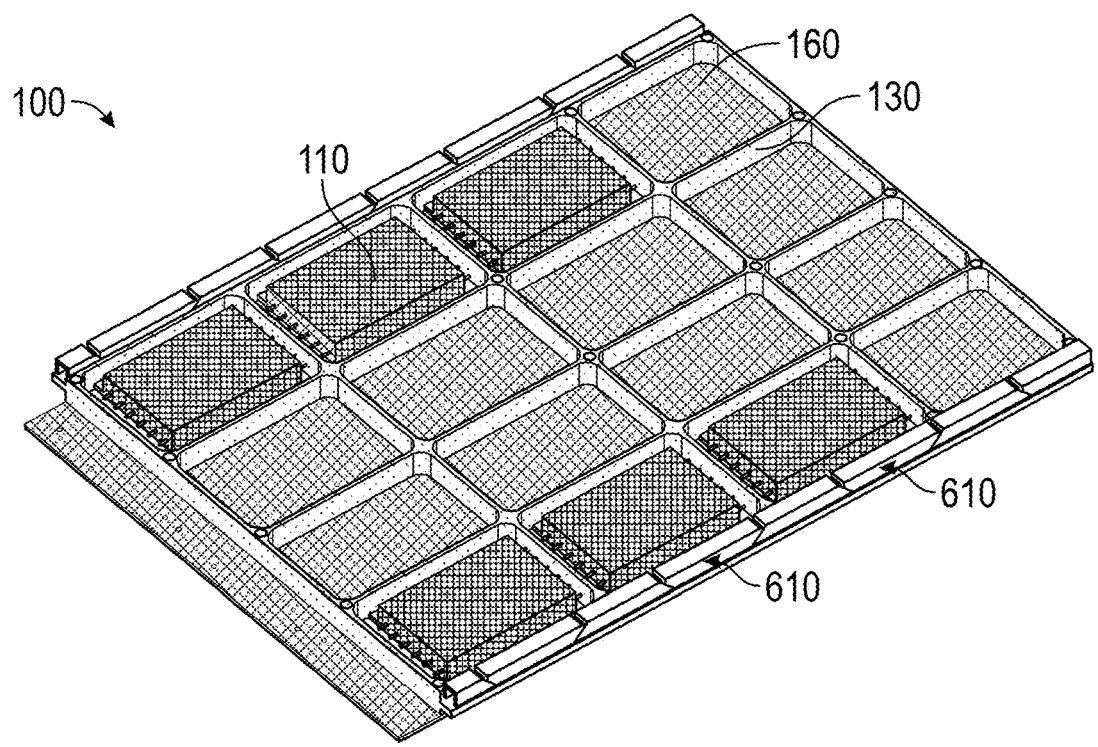
FIG. 6A shows an isometric view of the PWB assembly according to one or more embodiments.

FIG. 1 is an exploded view of a PWB assembly 100 according to one or more embodiments. Six electronic modules 110 sit on six thermal pads 120. The six thermal pads 120 fit on tray sections 135 of a stiffener 130. The stiffener 130 is adhered to the PWB 160 by an adhesive film 150. Edges of the stiffener 130 act as wedge lock mounting rails 140 for wedge locks 610 (FIG. 6A). Heat generated by the electronic modules 110 flows through the thermal pads 120 to the tray sections 135 and eventually flows to the wedge lock mounting rails 810, which act as heat sinks.

While six electronic modules 110 and corresponding thermal pads 120 and tray sections 135 are shown for explanatory purposes, the PWB assembly 100 is scalable. That is, the size of the tray sections 135, their number, and their location may be changed. Generally, relatively high heat-dissipating electronic components (e.g., diodes, magnetics) and electronic modules 110 are placed closer to the wedge lock mounting rails 140 to improve heat flow while lower heat-dissipating electronic components (e.g., resistors, capacitors) may be placed closer to the center of the PWB 160 and farther from the wedge lock mounting rails 140. In addition, lower heat-dissipating electronic components may be placed directly on the PWB 160 rather than on a tray section 135. In the exemplary case of the electronic modules 110 being DC-DC converters, the six exemplary DC-DC converters dissipate a total of 54 watts. Thermal analysis may be performed to verify that temperature requirements for a particular application are met by a given arrangement within a PWB assembly 100.

Figure 2A:
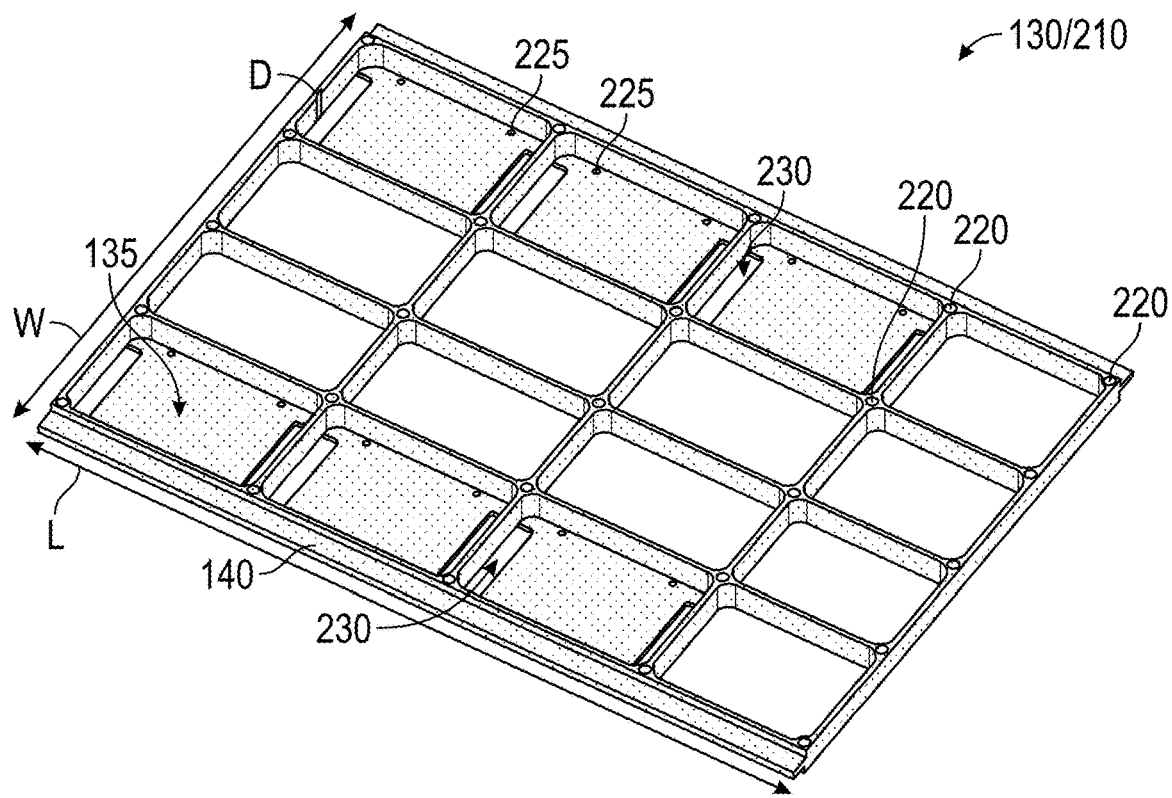
FIG. 2A shows an upper side of a stiffener according to an exemplary embodiment.
Figure 2B:
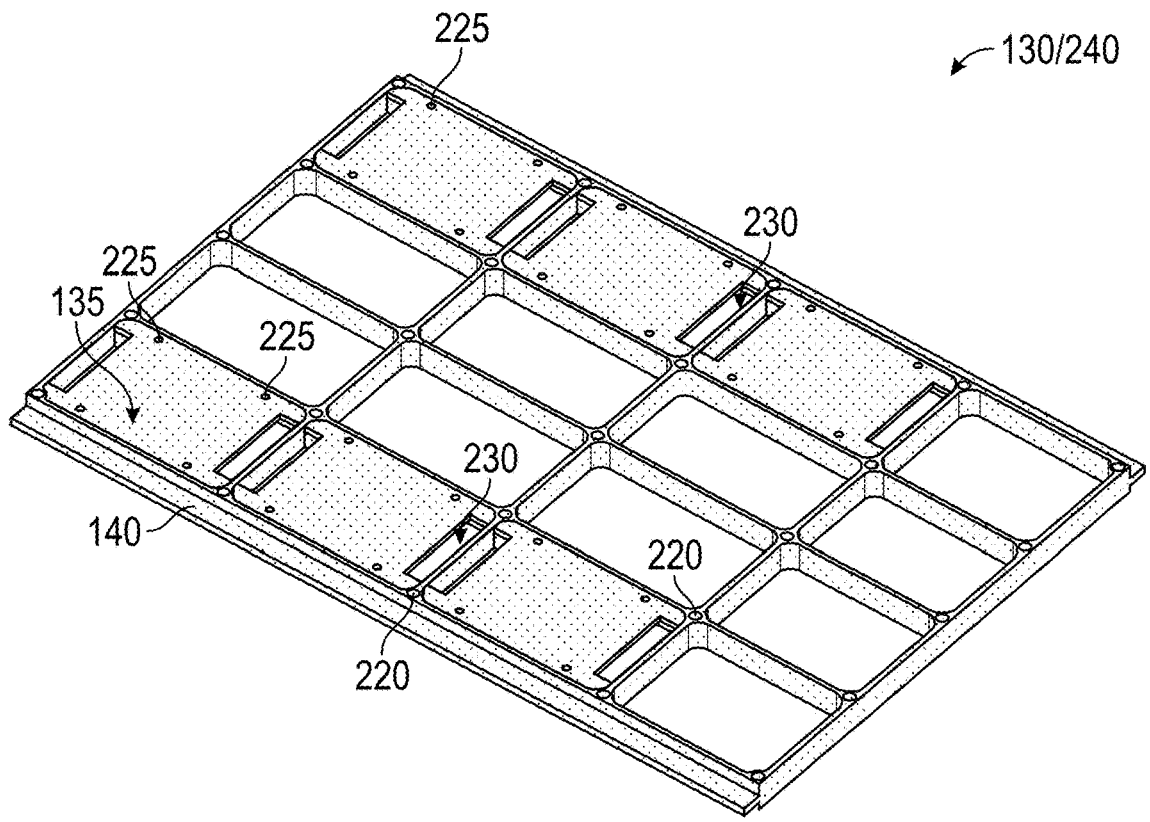
FIG. 2B shows a lower side of the stiffener shown in FIG. 2A.

FIGS. 2A and 2B show two sides of the stiffener 130 according to an exemplary embodiment. In the exemplary embodiment, the stiffener 130 includes six tray sections 135. FIG. 2A shows one side of the stiffener 130 referred to, for explanatory purposes, as an upper side 210. The view of FIG. 2A indicates that the tray sections 135 are recessed to accommodate the electronic modules 110. Exemplary dimensions of the tray section 135 to accommodate a DC-DC converter may be on the order of 3.8 inches for the length L, 2.8 inches for the width W, and 0.5 inches for the depth D. The tray section 135 may have a thickness on the order of 0.09 inches. The heat dissipation capability of the tray section 135 is not proportional to its thickness. The dimensions of the entire stiffener 130 may be on the order of 15 inches long and 11 inches wide in the exemplary case of accommodating six electronic modules 110. The stiffener 130 includes holes 220 that are used to secure the stiffener 130 to a PWB 160. Each tray section 135 is shown to include a hole 225 at each of the four corners to secure an electronic module 110 (FIG. 1) to the tray section 135. Each tray section 135 also includes gaps 230 to accommodate wires and pins. For example jumper wires from the module 110 can be passed through the gaps 230 and soldered to the PWB 160.

FIG. 2B shows a side of the stiffener 130 opposite the upper side 210 that is referred to, for explanatory purposes, as a lower side 240. The lower side 240 of the stiffener 130 is the side that is adhered to the PWB 160 by the adhesive film 150. Each tray section 135 may be machined such that the stiffener 130 is a single metallic structure. Because the tray sections 135 are integral parts of the stiffener 130, thermal interface resistance is eliminated between each tray section 135 and the stiffener 130. Elimination of the thermal interface resistance facilitates dissipation of higher heat than if the tray sections 135 were not part of the stiffener 130 (i.e., if there were thermal interface resistance). The material used for the stiffener 130 may be aluminum alloy, for example, because of the heat conduction properties and relatively light weight (e.g., compared with copper). Series 2000, 6000, and 7000 aluminum alloy may be used according to exemplary embodiments. The stiffener 130 serves a structural function in addition to a thermal one. Based on the specific application and related specifications for the PWB assembly 100, the stiffener 130 must provide sufficient support to comply with vibration and pyroshock requirements. Structural analysis may be performed to ensure that the PWB assembly 100 meets structural requirements for a particular application.

Figure 3:
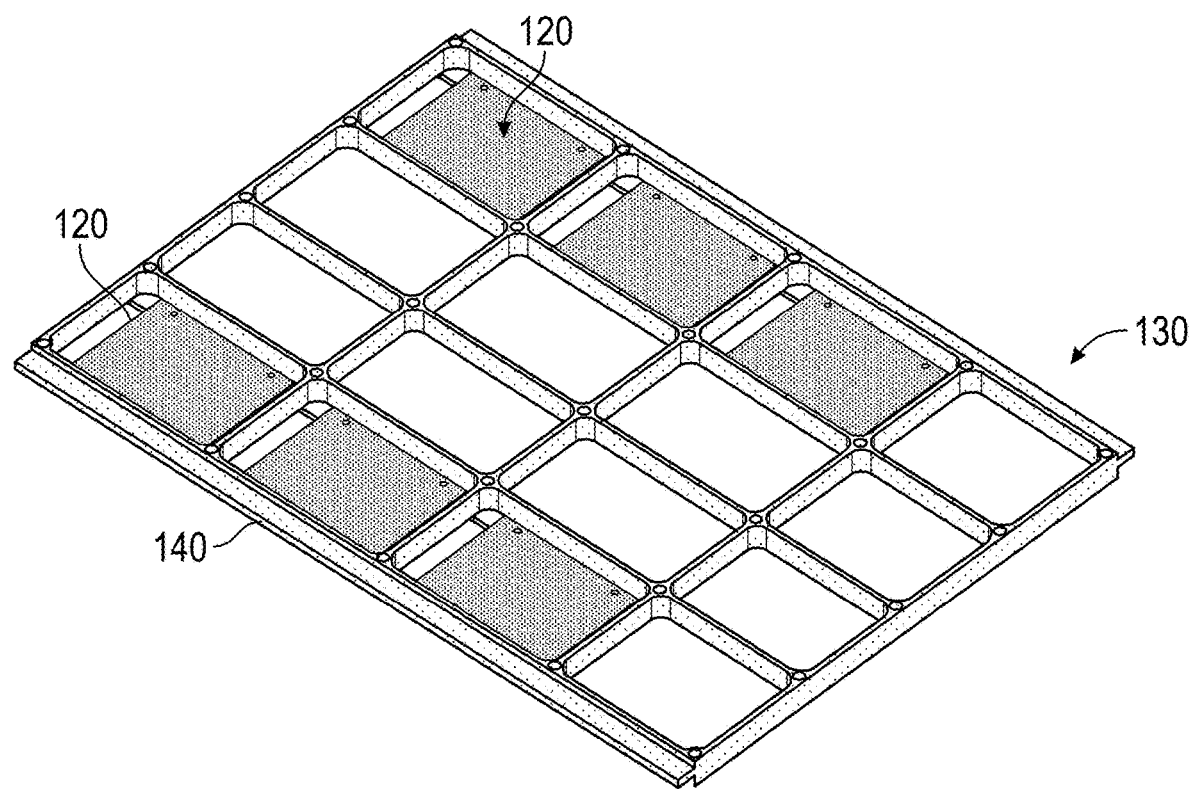
FIG. 3 shows thermal pads covering tray sections of the stiffener according to one or more embodiments.

FIG. 3 shows thermal pads 120 covering tray sections 135 of the stiffener 130 according to one or more embodiments. The thermal pads 120 are sized the same as the tray sections 135 of the stiffener 130 and are be placed on the tray sections 135 rather than being fastened or adhered. The thickness of the thermal pads 120 may be on the order of 0.01 inches, for example. The surface of the module 110 that would contact the tray section 135 directly, as well as the surface of the tray section 135 itself, are not entirely smooth. Thus, without the thermal pad 120 between each module 110 and the corresponding tray section 135, there would be an imperfect contact and, consequently, reduced heat flow between the module 110 and the tray section 135. The thermal pads 120 reduce thermal interface resistance and thereby increase the heat dissipation capability of the PWB assembly 100.

Figure 4:
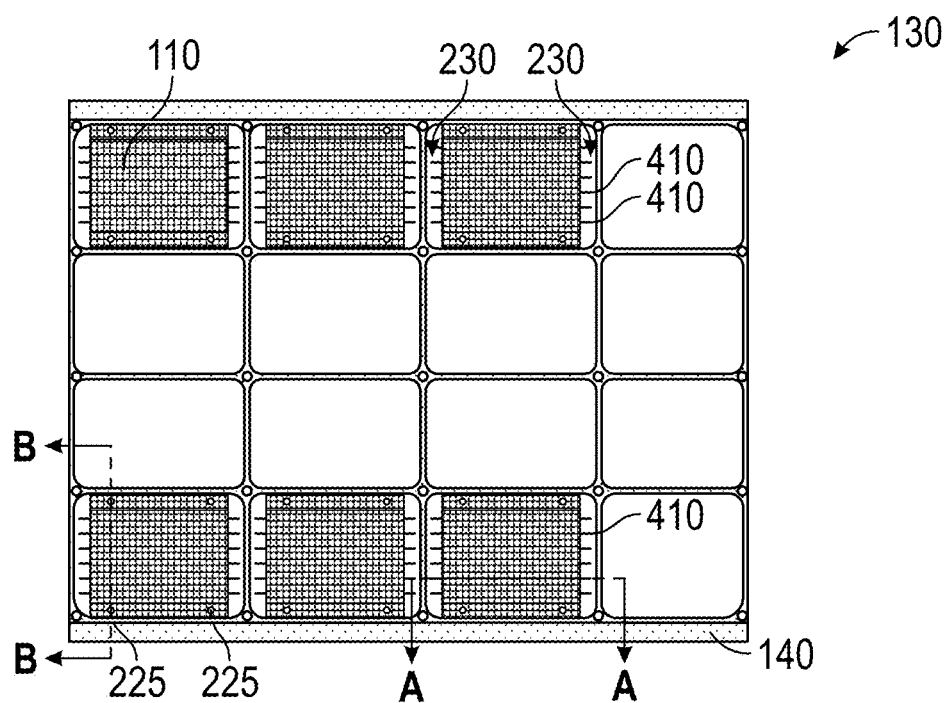
FIG. 4 shows modules on the thermal pads shown in FIG. 3.
Figure 5A:
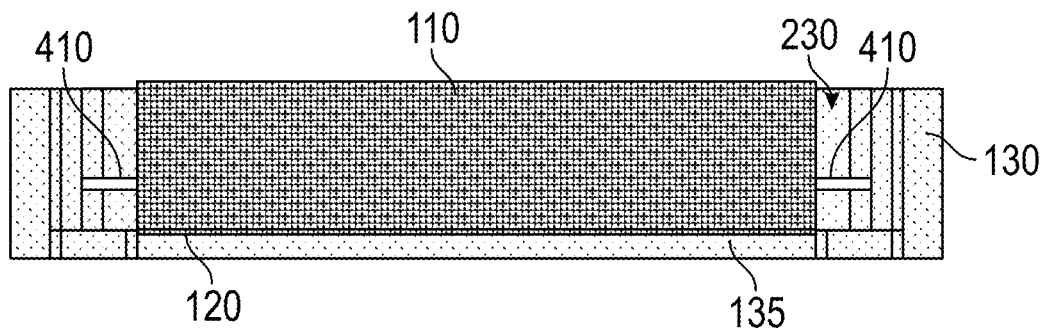
FIG. 5A is a cross-sectional view through A-A as indicated in FIG. 4.
Figure 5B:
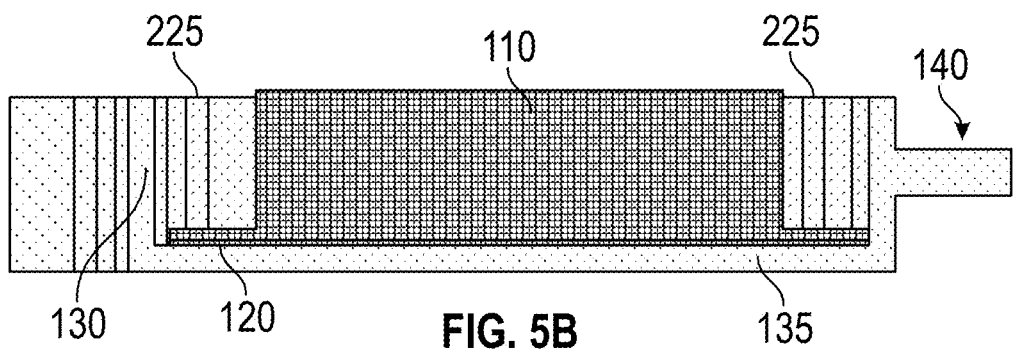
FIG. 5B is a cross-sectional view through B-B as indicated in FIG. 4.

FIG. 4 shows modules 110 on the thermal pads 120 shown in FIG. 3. Each exemplary module 110 is a DC-DC converter whose pins 410 extend into the gaps 230 on either side of each tray section 135 of the stiffener 130. Cross-sections A-A and B-B are respectively detailed in FIGS. 5A and 5B. FIG. 5A is a cross-sectional view through A-A as indicated in FIG. 4. The gap 230 on each side of the tray section 135 and the pins 140 in the gaps 230 are visible. The thermal pad 120 between the module 110 and the tray section 135 of the stiffener 130 is also visible in the view shown in FIG. 5A. FIG. 5B is a cross-sectional view through B-B as indicated in FIG. 4. As FIG. 4 indicates, the cross-section B-B aligns with the holes 225 used to secure the module 110 to the stiffener 130. These are visible on either side of the module 110 in FIG. 5B. A cross-section of the wedge lock mounting rail 140 is also visible in FIG. 5B.

Figure 6B:
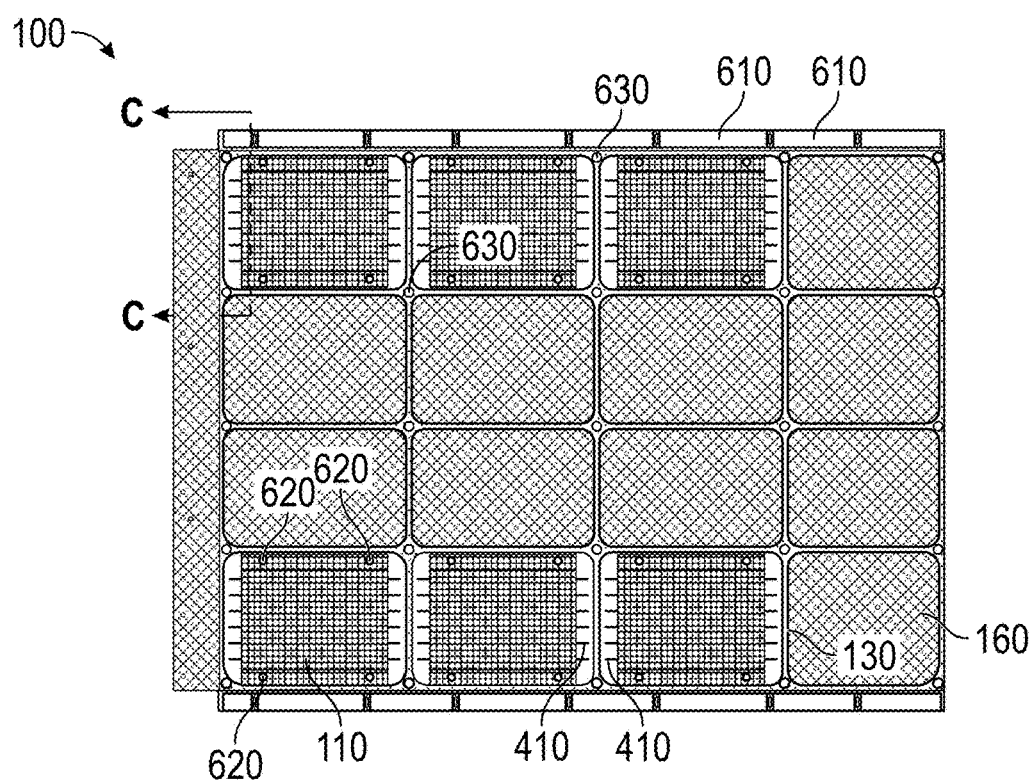
FIG. 6B is a top-down view of the PWB assembly according to one or more embodiments.

FIGS. 6A and 6B show two different views of the PWB assembly 100 according to one or more embodiments. FIG. 6A shows an isometric view of the PWB assembly 100. The wedge locks 610 are installed by applying torque on a wedge lock screw (not shown). The torque subjects the wedge locks 610 to both axial and normal force. The normal force is transferred to the stiffener 130 as a compressive force that ensures that the stiffener 130 is held firmly in place in a chassis of an electronic box, for example. The wedge locks 610 are supported by the wedge lock mounting rails 140 shown in FIG. 1. FIG. 6B is a top-down view of the PWB assembly 100. The screws 620 that fit in the holes 225 (FIG. 2) to affix the electronic modules 110 to the stiffener 130 are visible. The screws 630 that fit in the holes 220 (FIG. 2) to affix the stiffener 130 to the PWB 160 are also visible. The cross-section C-C indicated in FIG. 6B is shown in FIG. 8.

Figure 7:
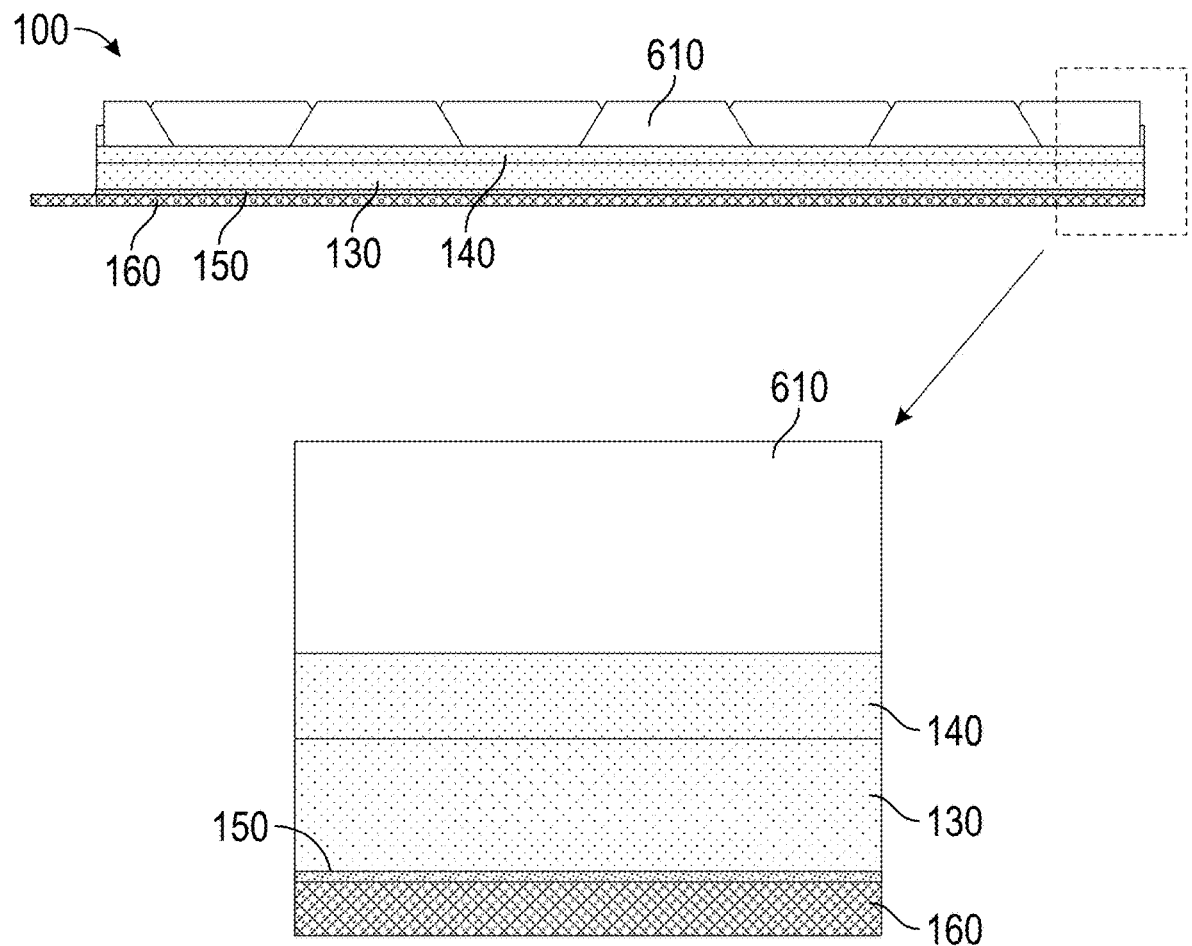
FIG. 7 is a side view of the PWB assembly according to one or more embodiments.

FIG. 7 is a side view of the PWB assembly 100 according to one or more embodiments. An expanded view of a portion of the side view is also shown. The side view shows the wedge lock mounting rail 140 below the wedge locks 610. This wedge lock mounting rail 140 is a portion of the stiffener 130 that extends as an edge as shown in FIG. 4. As previously noted, compressive force exerted by the wedge locks 610 hold the stiffener 130 firmly in place on the PWB 160. The adhesive film 150 between the stiffener 130 and the PWB 160, as well as the screws 630 (FIG. 6) also ensure attachment of the stiffener 130 and PWB 160.

Figure 8:
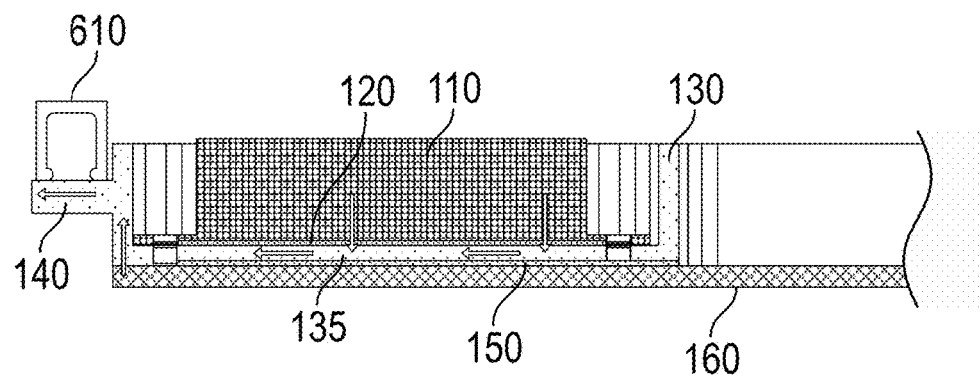
FIG. 8 is a cross-sectional view through C-C as indicated in FIG. 6B.

FIG. 8 is a cross-sectional view of the PWB assembly 100 through C-C as indicated in FIG. 6B. Arrows are used to indicate the heat transfer that takes place in the PWB assembly 100 according to one or more embodiments. Heat emitted by the electronic module 110 flows into the tray section 135 of the stiffener 130. As previously noted, the thermal pad 120 reduces thermal interface resistance between the electronic module 110 and the tray section 135 and, thereby, increases heat dissipation. The heat directed into the tray section 135 of the stiffener 130 is then directed to the edge of the stiffener 130, the wedge lock mounting rail 140. Thus, the wedge lock mounting rail 140 serves as a heat sink for the heat source (i.e., electronic module 110). The temperature of the wedge lock mounting rail 140 is controlled by a convective heat sink, a radiative heat sink, or both, for example.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronic assembly comprising:
    a printed wiring board (PWB);
    a stiffener secured to the PWB, wherein the stiffener includes one or more tray sections with gaps on two sides of each of the one or more tray sections of the stiffener; and
    one or more electronic modules secured respectively to the one or more tray sections of the stiffener, wherein each of the one or more electronic modules includes electronic components packaged together and interconnected within a single package.

2. The electronic assembly according to claim 1, further comprising wedge locks configured to secure the stiffener based on compressive force.

3. The electronic assembly according to claim 2, further comprising a first wedge lock mounting rail configured to support a first set of the wedge locks, and a second wedge lock mounting rail configured to support a second set of the wedge locks.

4. The electronic assembly according to claim 3, wherein a first edge of the stiffener forms the first wedge lock mounting rail, and a second edge of the stiffener forms the second wedge lock mounting rail.

5. The electronic assembly according to claim 1, wherein a material of the stiffener is aluminum alloy.

6. The electronic assembly according to claim 1, further comprising screws configured to affix the one or more electronic modules respectively to the one or more tray sections of the stiffener.

7. The electronic assembly according to claim 1, further comprising screws configured to affix the stiffener to the PWB.

8. The electronic assembly according to claim 1, further comprising an adhesive film configured to adhere the stiffener to the PWB.

9. The electronic assembly according to claim 1, further comprising one or more thermal pads disposed between each of the one or more electronic modules and respective ones of the one or more tray sections of the stiffener.

10. A method of assembling an electronic assembly, the method comprising:
    fabricating a stiffener with one or more tray sections;
    forming gaps on two sides of each of the one or more tray sections of the stiffener;
    securing the stiffener to a printed wiring board (PWB); and
    securing one or more electronic modules respectively to the one or more tray sections of the stiffener, wherein each of the one or more electronic modules includes electronic components packaged together and interconnected within a single package.

11. The method according to claim 10, further comprising arranging wedge locks to secure the stiffener based on compressive force.

12. The method according to claim 11, further comprising forming a first wedge lock mounting rail to support a first set of the wedge locks, and forming a second wedge lock mounting rail to support a second set of the wedge locks.

13. The method according to claim 12, wherein the forming the first wedge lock mounting rail is from a first edge of the stiffener, and the forming the second wedge lock mounting rail is from a second edge of the stiffener.

14. The method according to claim 10, wherein the fabricating the stiffener is from aluminum alloy.

15. The method according to claim 10, further comprising affixing the one or more electronic modules respectively to the one or more tray sections of the stiffener using screws.

16. The method according to claim 10, further comprising affixing the stiffener to the PWB using screws.

17. The method according to claim 10, further comprising adhering the stiffener to the PWB using an adhesive film.

18. The method according to claim 10, further comprising disposing one or more thermal pads between each of the one or more electronic modules and respective ones of the one or more tray sections of the stiffener.

* * * * *